United States Patent [19]

Rutz

[11] 4,246,548
[45] Jan. 20, 1981

[54] COHERENT SEMICONDUCTOR INJECTION LASER ARRAY

[75] Inventor: Elisabeth M. Rutz, Bethesda, Md.

[73] Assignee: International Business Machines Corporation, Armonk, N.Y.

[21] Appl. No.: 497,351

[22] Filed: Aug. 14, 1974

[51] Int. Cl.³ .......................... H01S 3/05; H01S 3/096
[52] U.S. Cl. ........................... 331/94.5 H; 331/94.5 C
[58] Field of Search ...................... 331/94.5 C, 94.5 H; 357/18

[56] References Cited

U.S. PATENT DOCUMENTS

| 3,340,479 | 9/1967 | Ashkin | 357/18 |
| 3,701,044 | 10/1972 | Paoli et al. | 331/94.5 H |
| 3,715,685 | 2/1973 | Gordon et al. | 331/94.5 H |
| 3,815,045 | 6/1974 | Ito | 357/18 |
| 3,835,415 | 9/1974 | Rutz et al. | 331/94.5 H |

OTHER PUBLICATIONS

Philipp-Rutz, "GaAs Laser Radiation", IEEE Journal of Quantum Electronics, vol. QE 8, No. 7, Jul. 1972, pp. 632-641.

Ripper et al., "Optical Coupling", Applied Physics Letters, vol. 17, No. 9, Nov. 1, 1970, pp. 371-373.

*Primary Examiner*—William D. Larkins
*Attorney, Agent, or Firm*—J. Jancin, Jr.; John E. Hoel; John G. Wynn

[57] ABSTRACT

Disclosed is a spatially coherent semiconductor injection laser array. The system comprises a plural element laser diode array placed symmetrical in respect to an optical axis. An external resonating cavity formed of spherical lenses and plane mirrors is disposed about the array with its axis of symmetry coincident with the optical axis. A spatial filter in the Fourier plane of the laser diode array selects the TEM$_{00}$ mode generated from each of the elements in the array. In operation, the system generates spatially coherent radiation from each of the elements of the array. The radiations are coherently coupled between all of the elements to provide a high optical power output in a spatially coherent beam.

3 Claims, 6 Drawing Figures

GaAs LASER DIODE ARRAY

GaAs LASER DEVICE WITH TWO-LASER DIODE ARRAY

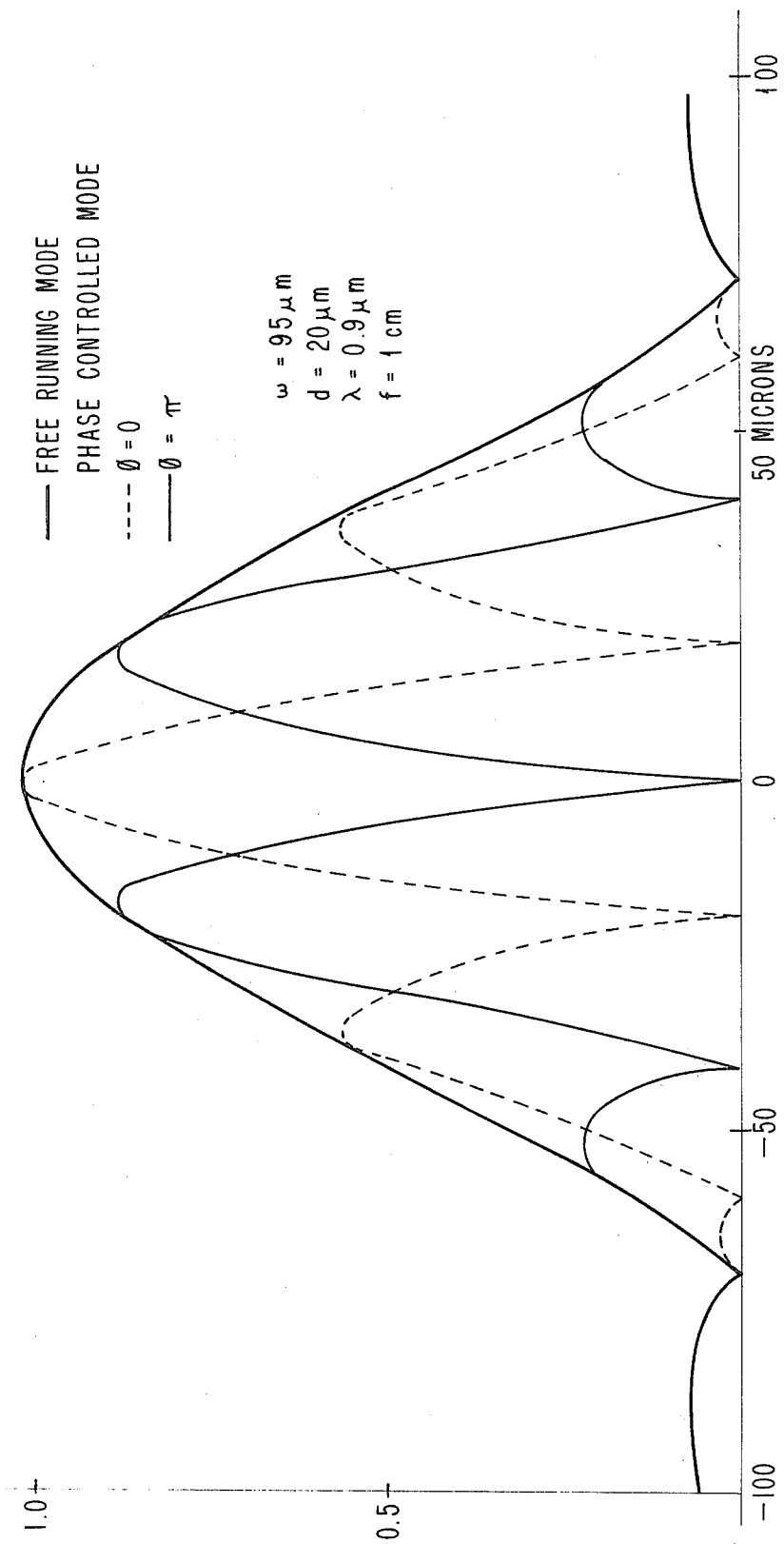

COHERENT SEMICONDUCTOR INJECTION LASER ARRAY

FIELD OF THE INVENTION

The invention disclosed herein relates to optical devices and more particularly relates to solid state lasers.

BACKGROUND OF THE INVENTION

Semiconductor injection lasers such as that disclosed in IEEE, Journal of Quantum Electronics, Vol. QE-8, July 1972, pages 632-641 by Elisabeth M. Phillip-Rutz, have been developed for use in optical space navigation systems and optical communication systems, where the radiation is confined to the lower order transverse mode. For this mode control, the laser diode, with one or both of its cleaved mirror faces antireflection coated, is operated in an external optical cavity in which an aperture limiting slit is used to reduce the lifetime of all transverse modes except the lowest order mode. Although laser arrangement such as that disclosed in the Rutz Quantum Electronics article is a simple, compact means for generating coherent radiation from a semiconductor laser, its radiative power output is limited.

Workers in the field have attempted other approaches to increasing the power output of semiconductor laser devices. One approach is that used in U.S. Pat. No. 3,701,044 to Paoli and Ripper. The Paoli et al., patent discloses the optical coupling of adjacent stripe contact geometry semiconductor lasers, from which a spatially coherent beam may be obtained. The Paoli device obtains its mode control to the $TEM_{00}$ mode by virtue of the narrow width of the respective laser stripes. The resonant cavity is formed by the cleaved end faces of the device. The coupling phenomenon is based upon optical leakage waves between adjacent stripe regions within the bulk of the device itself. The Paoli device appears to be limited in its spatially coherent power output because of the narrow width of the respective laser regions which are required for the mode control. What is needed in the art is a simple, compact semiconductor laser arrangement which efficiently generates a high radiative power output in a spatially coherent beam.

OBJECTS OF THE INVENTION

It is therefore an object of the invention to achieve a high radiative power output, spatially coherent radiation from a semiconductor laser in an improved manner.

It is a further object of the invention to achieve a high radiative power output, spatially coherent radiation from a semiconductor laser operating in an external resonator, in an improved manner.

It is still a further object of the invention to achieve a high radiative output, spatially coherent radiation from a semiconductor laser operating in an external resonator in a more efficient manner than was available in the prior art.

SUMMARY OF THE INVENTION

These and other objects of the invention are accomplished by the spatially coherent semiconductor injection laser array disclosed herein. A high radiative power output, spatially coherent laser device is disclosed having a plural element laser diode array placed symmetrically in respect to an optical axis. An external resonating cavity is disposed about the diode array with its axis of symmetry coincident with the optical axis. A spatial filter in the Fourier plane of the laser diode array selects the $TEM_{00}$ mode generated from each of the elements in the array. This arrangement produces spatially coherent radiation by each of the elements in the laser diode array and this spatially coherent radiation is coupled between all of the elements by means of the spatial filter to provide a high optical power output in a spatially coherent beam in an efficient manner.

DESCRIPTION OF THE DRAWINGS

The foregoing and other objects, features and advantages of the invention will be apparent from the following more particular description of the preferred embodiments of the invention as illustrated in the accompanying drawings.

FIG. 2 shows a field distribution at the second focal plane of the internal lenses in the optical cavity of FIG. 1 for the free running mode and the phase control mode of operation of the invention.

DISCUSSION OF THE PREFERRED EMBODIMENT

Figure 1A:
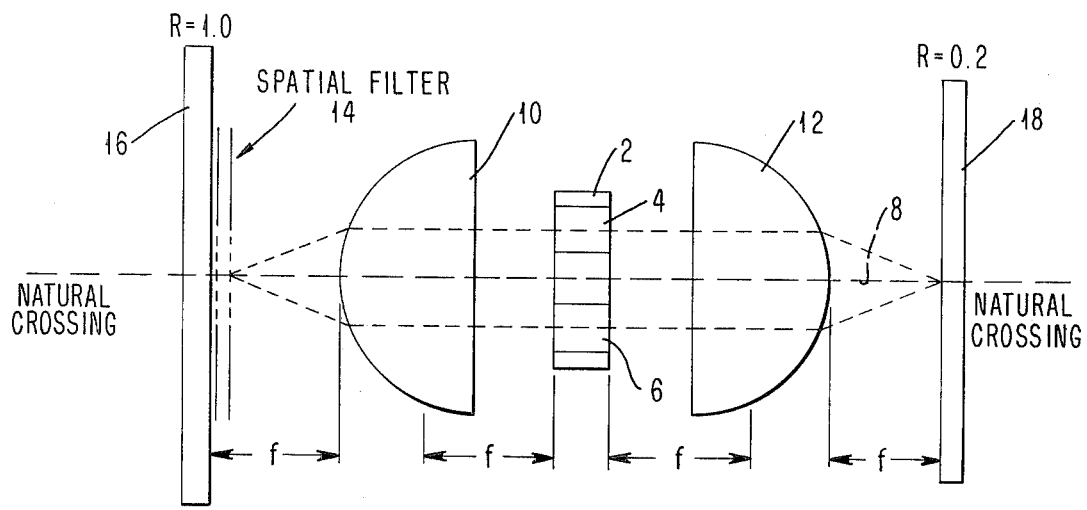
FIG. 1a shows a gallium arsenide laser device with a two laser diode array.

A spatially coherent GaAs laser with an external optical cavity and transverse mode control, using a single laser diode, has been reported previously.[1] To increase the optical power in the spatially coherent beam the single laser diode in the optical cavity was replaced by an array of laser diodes.

The external optical cavity of the GaAs laser is built of spherical lenses 10, 12 and plane mirrors 16, 18 with the laser diode array 2 and plane mirrors at the two focal planes of the internal lenses. The transverse mode selection makes use of the Fourier transform property of the lenses in the optical cavity. A spatial filter 14 is placed in front of the totally reflecting mirror 16 which reproduces the distribution resulting from the Fourier transform of the fields of the laser diodes in the array. To form a spatially coherent beam the filter is computed for the field of each of the laser diodes to be in the lowest order transverse mode; further, the computation assumes either, that the fields are all in phase, or, that the phases of the fields fluctuate randomly.

Every two laser diodes, for example 4 and 6, in the array 2 which are placed symmetrical to the optical axis 8, form a ring laser with the external optical cavity. In a ring laser, the oppositely directed wave trains can either be made to occur with controlled phases or the phases fluctuate randomly[2]. Thus, the GaAs laser diode array with the external optical mo e can either be operated in a phase controlled mode or in a free running mode. It is the spatial filter 14 which controls the transverse field distribution of the laser diodes and also selects either the phase controlled or the free running mode of the ring lasers.

Experimental results on the formation of a spatial coherent beam from a monolithic array of two diffused laser diodes are disclosed. The results are given for the free running and also for the phase controlled mode.

Formation of Spatially Coherent Beam From Laser Diode Array: To form a spatially coherent beam in the phase controlled mode from an array of laser diodes, applicant operates the array in the external optical resonator of the laser device and to use a spatial filter in front of the totally reflecting mirror of the cavity. The spatial filter reproduces the interference function resulting from the Fourier transform of the fields of the laser diodes in the array. To form a spatially coherent beam, the interference function is computed assuming that the field of each laser diode is in the lowest order transverse mode and also that the fields of all laser diodes are in phase.

The far-field distribution of the laser radiation is also given by this interference function. In the interference function, the amplitude of the non-zero order lobes is in reverse relation to the spacings between the laser diodes. In order to concentrate most of the intensity of the laser radiation in the zero-order lobe of the interference function, which is along the optical axis of the laser device, the spacings between laser diodes must be very much smaller than their widths.

To form a spatially coherent beam in the free running mode from an array of laser diodes, the field of each laser diode in the array is in the lowest order transverse mode, but the phase relation among these fields is not controlled. The inherent random fluctuations of the short wave trains, which form the laser beams, prohibit the formation of a stationary interference function. The spatial filter for this type of free running mode reproduces the field distribution resulting from the Fourier transform of the fields of each laser diode in the array. This transformed field distribution is the same for all the diodes in the array.

The transformed field distribution has Gaussian shape with its maximum along the optical axis of the laser device. The spatial filter which selects the free running mode is a single slit. The far-field distribution of the laser radiation has a single maximum and no non-zero order lobes. The far-field distribution is not affected by the spacings among laser diodes.

Beam transformation: The GaAs laser array with the external optical cavity is shown schematically in FIG. 1.[(1)] It is built of spherical lenses 10 and 12 and plane mirrors 16 and 18. In the optical cavity the p-n junction laser array 2 and the plane mirrors 16 and 18 are placed at the two focal planes of the external lenses 10 and 12.

Because of this symmetry along the optical axis 8, the field distribution at the mirrors is the Fourier transform of the fields of the laser array. The spatial coherency of the laser radiation is controlled by a spatial filter 14 at the totally reflecting mirror of the cavity.

Figure 1B:
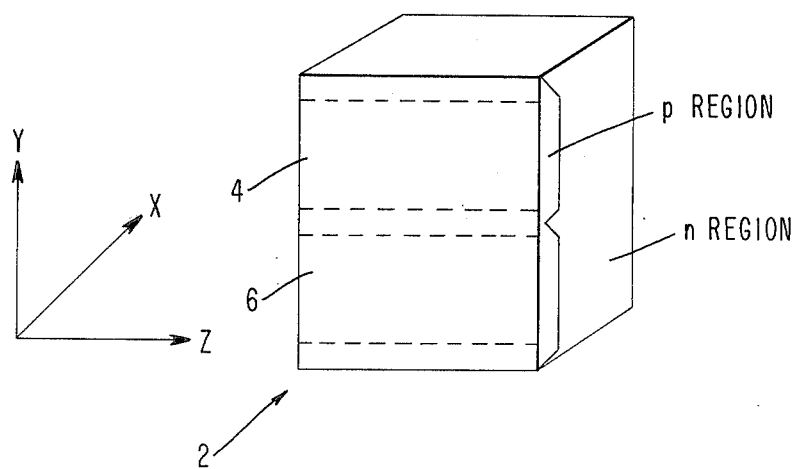
FIG. 1b shows an array of two laser diodes 4 and 6 which would occupy the position of the laser array 2 in FIG. 1a. The Z axis is coincident with the optical axis 6.
Figure 3A:
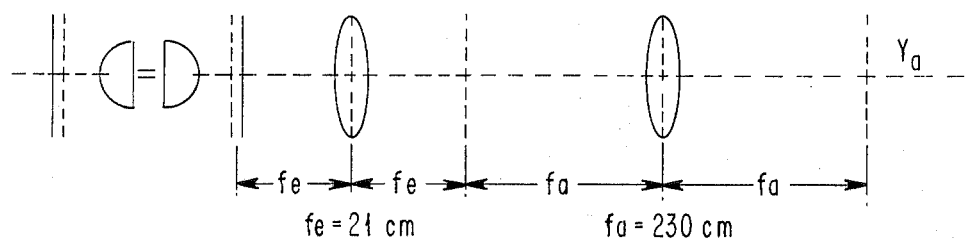
FIG. 3a shows experimental apparatus.
Figure 3B:
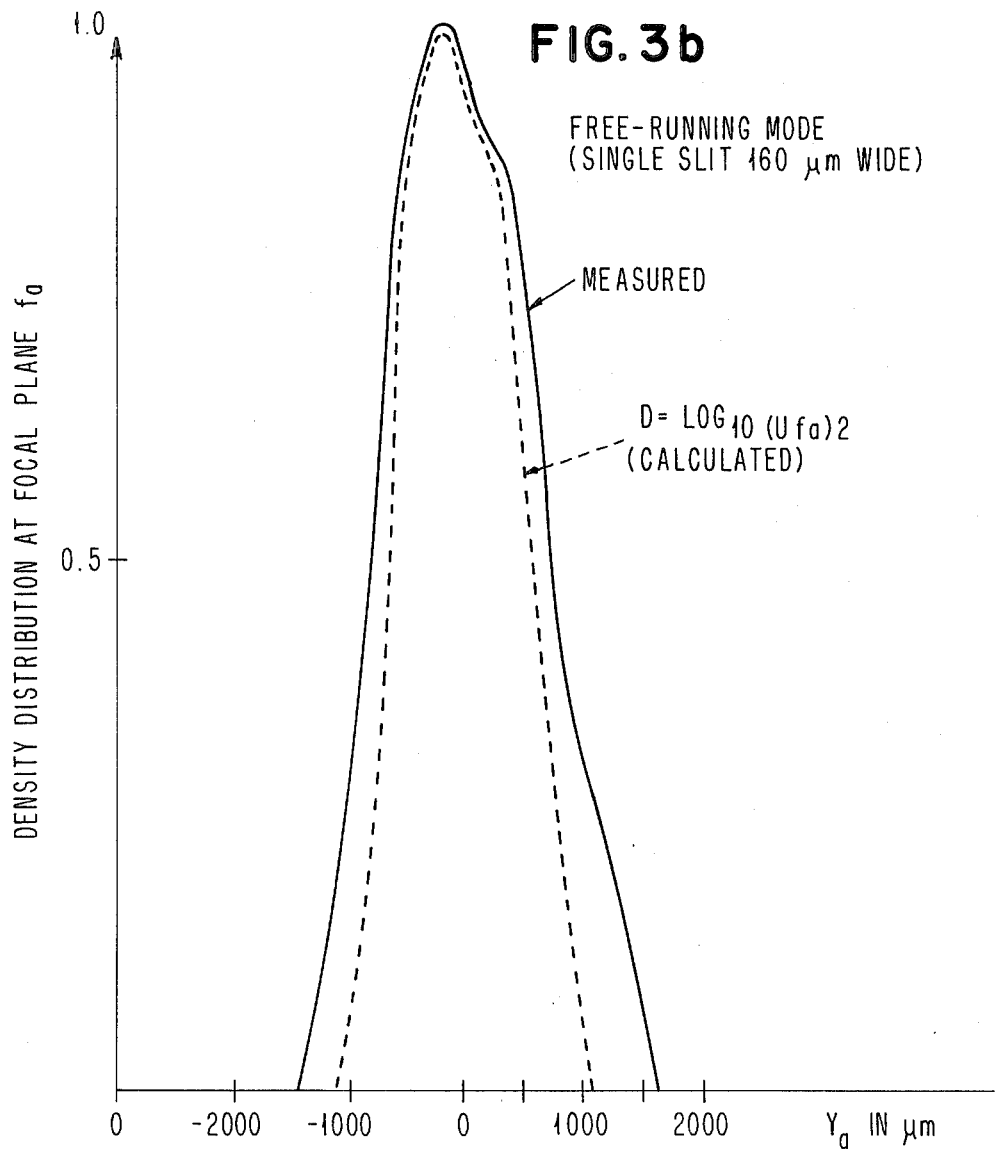
FIGS. 3b and 4 show measured results.

The field distribution at the mirrors, that is, at the second focal plane of the internal lenses $U_f(x_f, y_f)$ for an array of two laser diodes 4 and 6 shown in FIG. 1b, which are placed symmetrical to the optical axis of the external optical cavity, is $$U_f(x_f,y_f) \propto \int_{-\infty}^{+\infty} e^{-(\frac{x_o}{\omega_{ox}})^2} \left( \int_{d}^{2\omega_y + d} \sin\left(\frac{\pi}{2\omega_y}(y_o - d)\right) + e^{j(\pi+\phi(t))} \int_{-(2\omega_y + d)}^{-d} \sin\left(\frac{\pi}{2\omega_y}(y_o + c)\right) \right) e^{j\frac{2\pi}{\lambda_o f}(x_o x_f + y_o y_f)} dx_o\, dy_o \quad (1)$$

when the field distribution of the dielectric wave guide mode, perpendicular to the p-n junctions ($x_o$-direction), is assumed to be a Gaussian function and the field distribution of the lowest order transverse mode along the p-n junctions ($y_o$-direction), is approximated by a sine function; $\omega_{ox}$ is the spot radius of the dielectric wave guide mode, $2\omega_{oy}$ is the mode width of each laser diode along the p-n junction, $2d$ the distance between the fields of the laser diodes, $\phi(t)$ is the relative phase between the fields of the two laser diodes, f is the focal length of the internal lenses, and $\lambda_o$ the free-space wavelength.

The field distribution at the second focal plane perpendicular to the p-n junction from Equation 1 is $$U_f(x_f) \propto e^{-(\pi - \frac{\omega_{ox}}{\lambda_o f} x_f)^2} \quad (2)$$

and along the p-n junction, it is $$U_f(y_f) \propto \frac{\cos\left(\frac{2\pi}{\lambda_o}\frac{\omega_y}{f} y_f\right)}{\pi \omega_y^2 \left(\left(\frac{1}{2\omega_y}\right)^2 - \left(\frac{2}{\lambda_o}\frac{y_f}{f}\right)^2\right)} \left( e^{j\frac{2\pi}{\lambda_o}\frac{y_f}{f}(\omega_y+d)} - e^{-j(\frac{2\pi}{\lambda_o}\frac{y_f}{f}(\omega_y+d)-\pi-\phi(t))} \right) \quad (3)$$

Equation 3 is complex, it represents the superposition of the two waves at the second focal plane of the internal lenses, set up by the fields of the two laser diodes. The amplitude distribution of the two waves is the same. In fact, the amplitude distribution, having a single maximum symmetrical along the optical axis, is that of the transformed field distribution of a single laser diode. The phase front of the two waves is plane but tilted in respect to the normal to the optical axis. The tilt angles $\theta$ and $-\theta$ of the two waves are related to the phase advance and delay along the wave front in respect to the optical axis in Equation 3. The phase variation is:

$$\pm \Delta\phi = \pm(2\pi/\lambda_o)(y_f/f)(\omega_y+d) \quad (4)$$

and the tile angles are given by $$\pm \theta = \pm \arcsin\frac{\lambda_o}{2\pi f}\Delta\phi = \pm \arcsin\frac{\omega_y + d}{f} \quad (5)$$

In the external optical cavity in FIG. 1 the plane mirrors 16 and 18 at the second focal plane of the internal lenses 10 and 12 reflect the impinging waves, the output mirror 18 also partly transmits the waves. Because of conjugate tilt angles the impinging wave from each laser diode 4 will be reflected towards the symmetrically placed laser diode 6, setting up a traveling wave mode similar to that in a ring laser.

Free Running Mode:

In a ring laser two waves are traveling in opposite directions. The waves are modulated at frequencies equal to the frequency spacings among the longitudinal modes of the laser. Since the amplitudes and phases of the longitudinal modes, due to saturation fluctuate randomly, the oppositely directed waves are made up of randomly phased wave trains, which cannot form a stationary interference wave form. In effect, the relative $\phi(t)$ in Equation 3 between the two waves impinging on the plane mirrors of optical cavity, varies randomly.

The field distribution at the plane mirrors computed from Equation 3 is shown in FIG. 2 for typical values of $2w_y = 190$ microns, $d = 20$ microns, $f = 1$ cm and $\lambda_0 = 0.9$ microns. (Since the transverse optical field of the laser diodes extends beyond the active region, the mode width $2w_y$ was related to the p-n junction width $2w$ ($2w = 178$ microns) by the requirement that the intensity at $\pm w$ be $10^{-2}$ the intensity at the mode center and the spacing between the modes $2d = D - 2w_y$, where D is the distance between junction centers (D = 230 microns). The amplitude distribution of the fields at the plane mirrors in the free running mode is that of the spatially coherent mode of a single laser diode when transformed through the internal lens of the optical cavity.

To select this spatially coherent mode inherent to the free running laser, an aperture limiting slit of 150 microns width, which is matched to the mode width of the $TEM_{OO}$—mode, is placed in front of the totally reflecting mirror. The function of the aperture is to reduce the photon lifetime in all the transverse $TEM_{On}$ modes of each of the laser diodes in the array, except the lowest order transverse mode. The 150 microns wide aperture does not control the phase relation between oppositely direct waves in the ring laser. Experiments indicate that the free running mode with the randomly phased wave trains is the preferred mode of the laser array with the external optical cavity and the 150 micron wide aperture.

Phase Controlled Mode:

The GaAs laser array with the external optical cavity can also be operated in the phase controlled mode. To control the relative phase of the oppositely directed waves in the ring laser, a spatial filter 14 must be used which reproduces the interference function in Equation 3, corresponding to a certain phase relation. To form a spatially coherent laser beam, the two waves must be in phase at the output mirror 18 of the optical cavity. From Equation 3 we derive the interference function for $\phi = 0$, it is $$U_f \propto \frac{\cos\left(\frac{2\pi}{\lambda_o} \frac{\omega_y}{f} y_f\right)}{\pi \omega_y^2 \left(\left(\frac{1}{2\omega_y}\right)^2 - \left(\frac{2}{\lambda_o} \frac{y_f}{f}\right)^2\right)} \cos\left(\frac{2\pi}{\lambda_o} \frac{\omega_y + d}{f} y_f\right) \quad (6)$$

For comparison, the interference function for $\phi = \pi$ is given by $$U_f \propto \quad (7)$$

$$\frac{\cos\left(\frac{2\pi}{\lambda_o} \frac{\omega_y}{f} y_f\right)}{\pi \omega_y^2 \left(\left(\frac{1}{2\omega_y}\right)^2 - \left(\frac{2}{\lambda_o} \frac{y_f}{f}\right)^2\right)} \sin\left(\frac{2\pi}{\lambda_o} \frac{\omega_y + d}{f} y_f\right)$$

The functions are real, indicating that the phase front of the field at the plane mirrors, resulting from the vector addition of the two waves, is plane and perpendicular to the optical axis. The interference functions, evaluated from Equations 6 and 7, are also shown in FIG. 2, for the same diode dimensions as used before.

To select the spatially coherent mode inherent to the phase controlled ring laser, a spatial filter 14 which is matched to the interference function for $\phi = 0$ in FIG. 2, must be placed in front of the totally reflecting mirror 16 in the cavity. This filter reduces the photon lifetime in all transverse modes except the mode which results from in-phase superposition of the spatially coherent fields of the two laser diodes. However, the photon lifetime of the phase coherent mode can only be high when the oppositely directed wave trains in the ring laser are coincident at the plane mirror where the spatial filter is placed. This requires repetitive wave trains which cross at the plane mirror.

Investigation on a ring laser with a multitude of longitudinal modes have shown[2] that the oppositely directed wave trains can be made to cross at positions in the ring laser symmetrical in respect to the active medium of the laser (natural crossings). This has been accomplished by amplitude modulating each set of counterrotating longitudinal modes at approximately their separation frequency to couple them with well-defined amplitudes and phases.

In the GaAs laser array with the external optical cavity, the natural crossings which are symmetrical to the two laser diodes 4 and 6 actually take place at the plane mirrors 16 and 18. Also, in the phase controlled mode the photon lifetime of the optical cavity with the transverse mode control can only be long when the two oppositely directed wave trains are coincident at the natural crossings to form the interference function to which the spatial filter 14 is matched. For the laser to build up in the mode with the longest lifetime, a control seems to be exerted on the oppositely directed wave trains to become periodic and coincident at the natural crossings. The periodicity of the wave trains in turn are reflected in controlled amplitudes and phases of the longitudinal modes of the laser.

It was observed experimentally that the free running mode in the GaAs laser array with the external optical cavity and the 150 micron wide aperture is the dominant mode. But the selection of the free running mode can not result from the longer lifetime of this mode, since the width of the free running mode and the phase controlled modes, at the plane mirrors, is practically the same (FIG. 2). The selection of the free running mode, can rather be related to a difference in saturated gain in the two modes. There is the inverse relationship between the saturated gain and radiation intensity of the waves traveling in axial direction in the laser diodes, which can be effective in selecting the free running mode. In the free running mode, because of the random fluctuations in the amplitudes and phases of the longitudinal modes, the intensities of the oppositely directed wave trains are more evenly distributed than in the phase controlled mode where the more controlled amplitudes and phases of the longitudinal modes should result in periodic enhancement of the intensities in the oppositely directed wave trains. The higher intensities of the wave trains in the phase controlled mode can very well result in a transient reduction of the saturated gain which will not occur to the same degree in the free running mode.

Far-Field Distribution: The field distribution at the output mirror 18 of the laser array with the external optical cavity in the plane perpendicular to the p-n junction is given by Equation 2. In the plane along the junctions, the field distribution for the free running mode is given by Equation 3, and for the phase controlled mode by Equations 6 and 7. Because of the asymmetry of the p-n junction laser, the spatially coherent beam at the output mirror 18 in the plane perpendicular to the junction, is much wider than along the junction. To correct for the ellipticity of the laser beam, an external cylindrical lens is used. The focal plane of the external cylindrical lens is at the second focal plane of the internal lens, the curvature of the cylindrical lens is in the plane of the junctions.

The field distribution at the second focal plane of the cylindrical lens, in the plane of the junctions, is that of the laser diode array but magnified by the ratio $f_e/f$, where $f_e$ is the focal length of the cylindrical lens.

The far-field distribution of the GaAs laser array with the external cylindrical lens, in the plane perpendicular to the p-n junctions is $$U_{fa}|x_a \propto e^{+\infty} \int_{-\infty}^{+\infty} (-\pi \frac{\omega_{ox}}{\lambda_o f} x_f)^2 e^{j\frac{2\pi}{\lambda_o} \frac{x_f x_a}{z+2f_e}} dx_f \quad (8)$$

and in the plane of the junctions, it is $$U_{fa}|y_a \propto \left( \int_{d_e}^{2\omega_{ey}+d_e} \sin\left(\frac{\pi}{2\omega_{ey}}(y_e - d_e)\right) + \right.$$

$$\left. \int_{-(2\omega_e+d_e)}^{-d_e} \sin\left(\frac{\pi}{2\omega_{ey}}(y_e + d_e)\right) \right)$$

$$e^{\frac{2\pi}{\lambda_o} \frac{y_e y_a}{z}} dy_e \quad (9)$$

where $\omega_{ey} = \omega_y(f_e/f)$, $d_e = f_e/f$ and $z$ is the distance from the second focal plane of the cylindrical lens, in the direction of propagation. The Fourier transform in Equations 8 and 9 use the Fraunhofer approximation which is valid only when $$z >> \frac{2\pi}{\lambda_o} \frac{(2\omega_{ey}+d_e)^2}{2} \quad (10)$$

The solution of Equation 8 is $$U_{fa}|x_a \propto e^{-(\frac{f x_a}{z+2f_e} \frac{1}{\omega_{ox}})^2}$$

The solution of Equation 9 for the free-running mode of the laser is $$U_{fa}|y_a \propto \frac{\cos\left(\frac{2\pi}{\lambda_o} \frac{\omega_{ey}}{z} y_a\right)}{\pi \omega_{ey}^2 \left((\frac{1}{2\omega_{ey}})^2 - (\frac{2}{\lambda_o} \frac{y_a}{z})^2\right)^2} \quad (12)$$

$$\left(e^{j\frac{2\pi}{\lambda_o}\frac{y_a}{z}(\omega_{ey}+d_e)} - e^{-j(\frac{2\pi}{\lambda_o}\frac{y_a}{z}(\omega_{ey}+d_e)-\pi-\phi(t))}\right)$$

The solution of Equation 9 for the phase controlled mode, for $\phi = 0$, is $$U_{fa}|y_a \propto \quad (13)$$

$$\frac{\cos\left(\frac{2\pi}{\lambda_o}\frac{\omega_{ey}}{z} y_a\right)}{\pi\omega_{ey}^2\left(\left(\frac{1}{2\omega_{ey}}\right)^2 - \left(\frac{2}{\lambda_o}\frac{y_a}{z}\right)^2\right)} \cos\left(\frac{2\pi}{\lambda_o}\frac{\omega_{ey}+d_e}{z} y_a\right)$$

and for $\phi = \pi$, it is $$U_{fa}|y_a \propto \quad (14)$$

$$\frac{\cos\left(\frac{2\pi}{\lambda_o}\frac{\omega_{ey}}{z} y_a\right)}{\pi\omega_{ey}^2\left(\left(\frac{1}{2\omega_{ey}}\right)^2 - \left(\frac{2}{\lambda_o}\frac{y_a}{z}\right)^2\right)} \sin\left(\frac{2\pi}{\lambda_o}\frac{\omega_{ey}+d_e}{z} y_a\right)$$

The far-field of the laser array with the optical cavity, the spatial filter and the cylindrical lens, in Equations 11, 12 and 13 is that of a spatially coherent beam. In the free running mode, the far-field distribution along the p-n junctions is that of the single laser diode in the array, with a single maximum symmetrical in respect to the optical axis and small side lobes. The tilt angles of the plane wave fronts $$\pm \theta_e = \pm \arcsin \frac{\omega_e + d_e}{z}$$

become smaller with increasing distance, and becomes zero for $z \to \infty$.

The far-field in effect is that formed by the two spatially coherent beams from the magnified field distributions of the two laser diodes. The maxima of the two beams are spaced $(2w_e + 2d_e)$ apart. The beams expand as they propagate in space, but the maxima remain stationary, such that in the far-field the two beams seem to coincide. In the free running mode of the laser, because the oppositely directed waves are made up of randomly phased wave trains, there is no interference between the fields of the two laser beams, but their intensities are added.

The far-field of the laser with the external cylindrical lens in the phase controlled mode (Equation 13) is the product of two functions, one is the field of the single laser diode and the other represents the interference of the waves from the two laser diodes. The zero-order component of the interference function is along the optical axis of the laser, the intensity of the higher order components is affected by the spacing between the laser diodes. To concentrate most of the laser energy into the zero-order diffraction lobe the spacing between the diodes 4 and 6 must be made extremely small.

The technique of forming a spatially coherent laser beam can be extended to a monolithic array 2 of more than two diodes. In the free running mode the mode-selecting aperture need not be changed when the number of diodes in the array is increased and the far-field distribution is also given by Equations 11 and 12. Only the optical path length for the Fraunhofer approximation to be valid, become larger. For an array of n laser diodes, Equation 12 is valid only when $$z >> \frac{2\pi}{\lambda_o}\left(\frac{n\omega_{ey} + (n-1)d_e}{2}\right)^2$$

In the phase controlled mode a different spatial filter 14 is required when the number of diodes in the array is increased. Since the width of the diffraction lobes in the interference function becomes smaller with increased number of diodes, a spatial filter 14 with narrower slits must be used. Equation 14 is also valid for the phase controlled mode.

Experimental Results: Experiments were performed using a monolithic array 2 of the two diffused homostructure GaAs laser diodes 4 and 6 in the external optical cavity, shown in FIG. 1. The optical cavity is built of spherical lenses 10 and 12 of 1 cm focal length and plane mirrors 16 and 18 with reflectivities of 1.0 and 0.2, respectively. The laser diode array 2 is mounted on metal heat sinks which provide common contacts to both diodes. The preparation of the laser diodes has been reported previously[1]. The width of each laser diode in the array is 178 μm and the distance between diode centers is 230 μm. The mirror faces of the laser diodes 4 and 6 are anti-reflection coated.

To form a spatially coherent beam a spatial filter 14 is placed in front of the totally reflecting mirror 16 inside the cavity. The function of the spatial filter 14 is to confine the fields of the laser diodes 4 and 6 to those of the lowest order transverse mode and also to determine whether the mode is free running or phase controlled. In the phase controlled mode the spatial filter selects a predetermined phase relation between the fields of the two laser diodes.

The spatial filter 14 for the free running mode (Equation 3) and for the phase controlled mode for $\phi=\pi$ (in Equation 7) requires only a single slit of 150 microns and 90 microns width, respectively. The spatial filter which selects the phase controlled mode for $\phi=0$ (Equation 6) requires three closely spaced slits which are matched to the zero-order and first-order diffraction lobes of the interference function (in FIG. 2). Since this type of spatial filter was not available to select the phase controlled mode for $\phi=0$ only a single slit of 50 microns width was used, corresponding to the width of the zero-order lobe.

The experiments were performed at room temperature, the shape of the injection current pulses was close to that of a cosine function, the pulse half-width was 100 $n_s$ and the pulse repetition frequency was 2 k Hz.

Applicant has observed the synthesized far-field distribution of the laser radiation. The radiation from the laser was not examined directly, but was transformed through an external cylindrical lens of 21 cm focal length, in order to reduce the ellipticity of the laser beam. The far-field distribution itself could not be measured in our laboratory. (The condition for the validity of the Fraunhofer approximation for the radiation from the laser, transformed through the external cylindrical lens (Equation 10), requires an optical path length of more than 62m.)

We have synthesized the far-field by observing the field distribution at the second focal plane of a spherical lens. The other focal plane of this lens coincided with the second focal plane of the external cylindrical lens.

From the similarity of the beam transformation from near-field to far-field, and of the beam transformation through a lens, we conclude that Equations 11, 12 and 13, which describe the far-field distribution are also valid for the field distributions at the second focal plane of the external spherical lens, when the far-field parameter z is replaced by the focal length fa.

To evaluate the synthesized far-field distribution of the laser beam, an image was formed on a photographic plate and the density distribution of the image was then recorded using a microdensitometer. Within this linear region of the characteristic curve of the photographic plate, the density distribution of the image (D) is related to the logarithm of the intensity distribution $(Uf_a)^2$ across the laser beam, it is:

$$D = \log_{10}(U_{fa})^2 \tag{14}$$

In the experiments the free running mode of the laser array with the external optical cavity was selected by using a spatial filter 14 formed by a single slit of 150 microns width. This slit is matched to the mode width of the free running mode in FIG. 2. The image of the laser beam on the photographic plate, taken at the second focal plane of the external spherical lens and the density distribution of the image, along the p-n junctions show the density distribution computed from Equations 11 and 14 for the diode dimension given in Section III and for $f_a = 230$ cm.

The intensity distribution across the laser beam in the free running mode has a single maximum and no grating lobes. The recorded function shows good agreement with the computed function, though the recorded function is slightly wider. The larger width, especially in the region of low densities might be explained by the deviation of characteristic curve of the photographic plate from the linear region.

Since the recorded distribution of the free running mode does not resemble that of an interference function, it seemed important to ascertain whether the fields of both laser diodes in the array actually have contributed to the beam. To do so, the intensity distribution was also investigated in the region between the lens and the focal plane, where the two laser beams do not coincide. The density distribution recorded at a distance of 130 cm from the external spherical lens actually shows the two maximums, corresponding to the intensity distributions of the two laser beams.

These observations confirm the assumption that in the free running mode of the laser array with the external optical cavity, the oppositely directed waves are made up of randomly phased wave trains, which do not form a stationary interference wave form. The far-field distribution is that of a spatially coherent beam where the fields from the two laser diodes 4 and 6 of the array occupy the same place in space but not in time.

Figure 4:
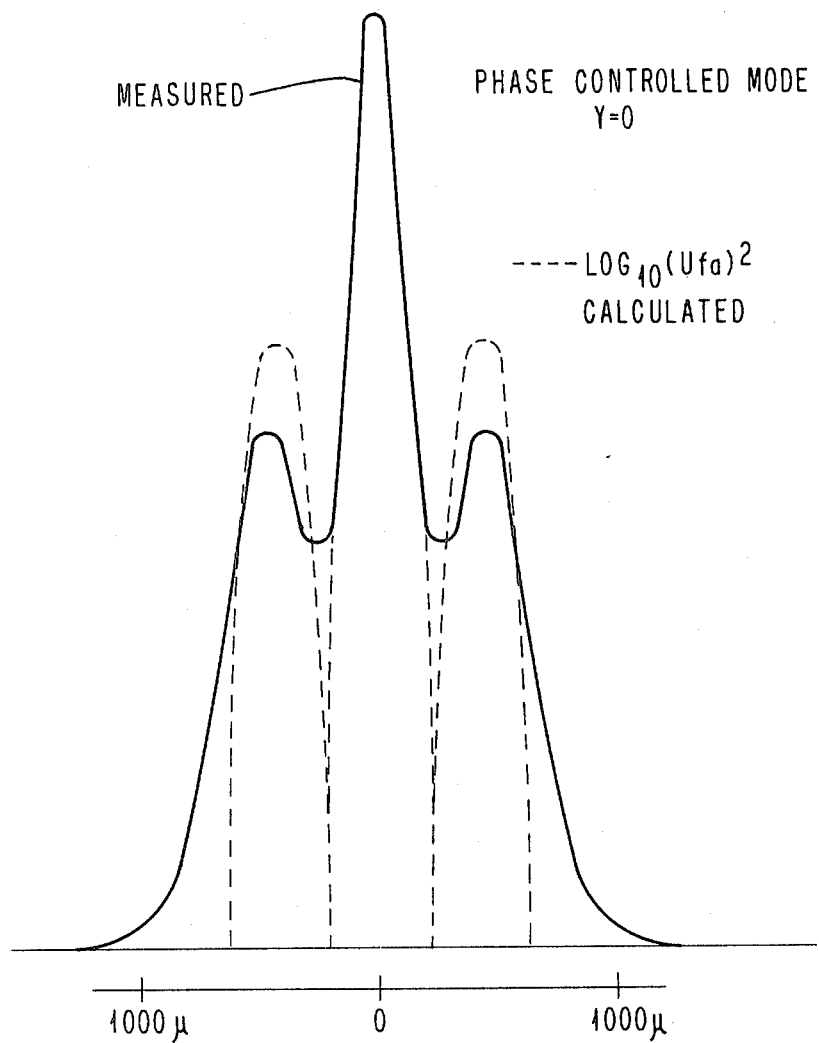

Further, in our experimental investigation the phase controlled mode of the laser array with the external optical cavity was selected by reducing the width of the aperture limiting slit to 50 microns. This slit width is matched to the width of the zero-order lobe of the phase controlled mode for $\phi=0$. Then the image of the laser radiation was formed on a photographic plate placed at the second focal plane of the external spherical lens and the density distribution along the p-n junctions was recorded. The result is shown in FIG. 4, together with the computed outlines from Equations 13 and 14.

In the phase controlled mode the intensity distribution across the laser beam is that of an interference function. Since this interference pattern can only be formed when the oppositely directed wave trains in the ring laser occur periodically and are coincident at the natural crossings, applicant concludes that the narrower spatial filter which reduces the proton lifetime for the free running mode also seems to couple the longitudinal modes of the laser with well defined amplitudes and phases to form wave trains, which occur periodically and are coincidental at the natural crossings.

REFERENCES

1. E. M. Phillip-Rutz, "High Radiance Room Temperature GaAs Laser with Controlled Radiation in a Single Traverse Mode", IEEE J. Quantum Elect., Vol. QE-8, No. 7, July 1972, pages 632–641.
2. N. Bucholz and M. Choworow, "Acoustic Wave Amplitude Modulation of a Multimode Ring Laser", IEEE J. Quantum Elect., Vol. QE-3, No. 11, November 1967, pages 454–459.

While the invention has been particularly shown and described with reference to the preferred embodiments thereof, it will be understood by those of skill in the art that the foregoing and other changes in form and details may be made therein without departing from the spirit and scope of the invention.

I claim:

1. A spatially coherent solid state laser device comprising:
   a plural element laser array disposed symmetrically with respect to an optical axis;
   an external resonating cavity formed of spherical lenses and plane mirrors disposed about said plural element laser array with its axis of symmetry coincident with said optical axis;
   a phase control mode spatial filter disposed in the Fourier plane of said plural element laser array for selecting only the $Tem_{OO}$ mode generated by each of said elements in said plural element laser array, said spatial filter forming a spatially coherent laser beam from the radiation of said laser elements symmetrically disposed about said optical axis so that the waves produced thereby are in phase at an output mirror of said optical cavity, and said spatial filter reproducing the interference function in said Fourier plane which results when the field of each laser in said plural element laser array is in the lowest order traverse mode, and when said fields are in phase said interference function is determined by the number of said lasers in said plural element laser array, their width and their spacing;
   whereby spatially coherent radiation is generated by each of said elements of said plural element laser array and coupled therebetween to provide a high optical power output in a spatially coherent beam.

2. The spatially coherent laser device of claim 1 wherein said plural element laser array comprises GaAs laser diodes.

3. A spatially coherent solid state laser device comprising:
   a plural element laser array disposed symmetrically with respect to an optical axis;
   an external resonating cavity formed of spherical lenses and plane mirrors disposed about said plural element laser array with its axis of symmetry coincident with said optical axis;
   a free running mode spatial filter disposed in the Fourier plane for controlling the field of each laser of said plural element laser array to be in the lowest order transverse mode, said free running mode spatial filter not controlling the relative phase angle of said laser fields, which fluctuate randomly in said transverse mode, the width of said free running mode spatial filter being inversely proportional to the width of each single laser in said plural element laser array, and said transverse mode not being determined by the number of lasers in said plural element laser array or their spacings, thereby not requiring a change of said free running spatial filter when the number of said lasers in said plural element laser array is increased.

* * * * *